(12) United States Patent
Kuo et al.

(10) Patent No.: US 11,921,543 B2
(45) Date of Patent: Mar. 5, 2024

(54) METHOD AND APPARATUS FOR AN INTELLIGENT WIRELESS FAN DOCK

(71) Applicant: Dell Products, LP, Round Rock, TX (US)

(72) Inventors: Lee-Ching Kuo, Taipei (TW); Hong Ling Chen, Taoyuan (TW); Hou Chun Wang, Linkou District (TW); En-Yu Jen, New Taipei (TW); Chen-Yu Lin, Songshan District (TW)

(73) Assignee: Dell Products, LP, Round Rock, TX (US)

( * ) Notice: Subject to any disclaimer, the term of this patent is extended or adjusted under 35 U.S.C. 154(b) by 121 days.

(21) Appl. No.: 17/732,254

(22) Filed: Apr. 28, 2022

(65) Prior Publication Data

US 2023/0350455 A1   Nov. 2, 2023

(51) Int. Cl.
| | |
|---|---|
| G06F 1/16 | (2006.01) |
| G06F 1/20 | (2006.01) |
| G06F 1/3234 | (2019.01) |
| H04W 4/80 | (2018.01) |
| H05K 7/20 | (2006.01) |

(52) U.S. Cl.
CPC .......... G06F 1/1632 (2013.01); G06F 1/203 (2013.01); G06F 1/206 (2013.01); G06F 1/3234 (2013.01); H04W 4/80 (2018.02); H05K 7/20172 (2013.01); H05K 7/20209 (2013.01)

(58) Field of Classification Search
CPC ........ G06F 1/1632; G06F 1/203; G06F 1/206; G06F 1/3234; H04W 4/80; H05K 7/20172; H05K 7/20209
See application file for complete search history.

(56) References Cited

U.S. PATENT DOCUMENTS

| | | | |
|---|---|---|---|
| 11,391,482 B2 * | 7/2022 | Higuchi | F24F 11/54 |
| 2007/0101773 A1 * | 5/2007 | Park | D06F 39/008 |
| | | | 68/5 R |
| 2017/0102747 A1 * | 4/2017 | Ragupathi | H05K 7/20736 |

* cited by examiner

*Primary Examiner* — Henry Tsai
*Assistant Examiner* — John B Roche
(74) *Attorney, Agent, or Firm* — Prol Intellectual Property Law, PLLC; H. Kenneth Prol (57) ABSTRACT

A system and method of docking an information handling system to an intelligent wireless fan dock comprising a docking sensor to detect a docking event, a wireless module to establish a wireless link of the intelligent wireless fan dock with the docked information handling system upon detection of a docking event and to receive a dynamic fan speed request command to adjust extended fan cooling airflow from fan dock control system operating at the docked information handling system, where the fan dock control system has determined that the docked information handling system and the intelligent wireless fan dock pairing enables an increased performance mode and altered power draw limitations for the docked information handling system relative to the information handling system in an undocked state, and increasing the extended fan cooling airflow of a cooling fan based on the dynamic fan speed request command from the docked information handling system.

20 Claims, 6 Drawing Sheets

METHOD AND APPARATUS FOR AN INTELLIGENT WIRELESS FAN DOCK

FIELD OF THE DISCLOSURE

The present disclosure generally relates docking system for use with an information handling system. The present disclosure more specifically relates to a docking system with extended cooling airflow controlled when operatively coupled to the information handling system.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling needs and requirements vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities. With so many systems in operation, the information handling system may have active or passive cooling system for thermal control. Further, the information handling system may be operatively coupled to a docking system such as a docking station or docking platform.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

A trend for light, thin information handling system designs constrains internal system thermal solutions for those information handling systems whether those are passive or actively controlled thermal control systems. In embodiments of the present disclosure, an extended active thermal control system may be implemented with a docking system for a mobile information handling system such as a laptop or 360-degree convertible laptop system. For example, an extended thermal fan module with one or more external fans may be incorporated into a docking station that may be operably coupled to the mobile information handling system in some embodiments. This intelligent wireless fan dock may include one or more controllable fans, where any or all of the fans may be independently controlled in coordination with the docked mobile information handling system according to embodiments herein.

According to embodiments, a wired or wireless coupling or some combination of couplings may be established between the docked information handling system and the intelligent wireless fan dock via wireless modules onboard of the fan docking system. This wired or wireless connectivity in various embodiments may provide for communication and control of the extended fan capacity of one or more fans in the intelligent wireless fan dock in coordination with the docked information handling system operational needs. A controller in the intelligent wireless fan dock may communicate wirelessly, or via a wired connection is some embodiments, with the docked information handling system and control one or more fans disposed in the intelligent wireless fan dock. The fans of the intelligent wireless fan dock may be disposed at various locations that correspond with zones or locations on a docked information handling system that may contain or house one or more heat producing components in some embodiments as well. As the operation of the docked information handling system changes, a fan docking control system may alter speed or cooling capacity of one or plural extended thermal fans in the intelligent wireless fan dock and may coordinate with a particular fan that is located under a component anticipated to produce greater heat. With this dynamically controllable extended thermal cooling capacity of the intelligent wireless fan dock, the information handling system may boost system performance of one or more components and adjust power limit settings to utilize higher power levels for performance while being enabled to control internal temperatures as well as skin surface temperatures of the docked information handling system within required thermal tolerances.

Figure 1:
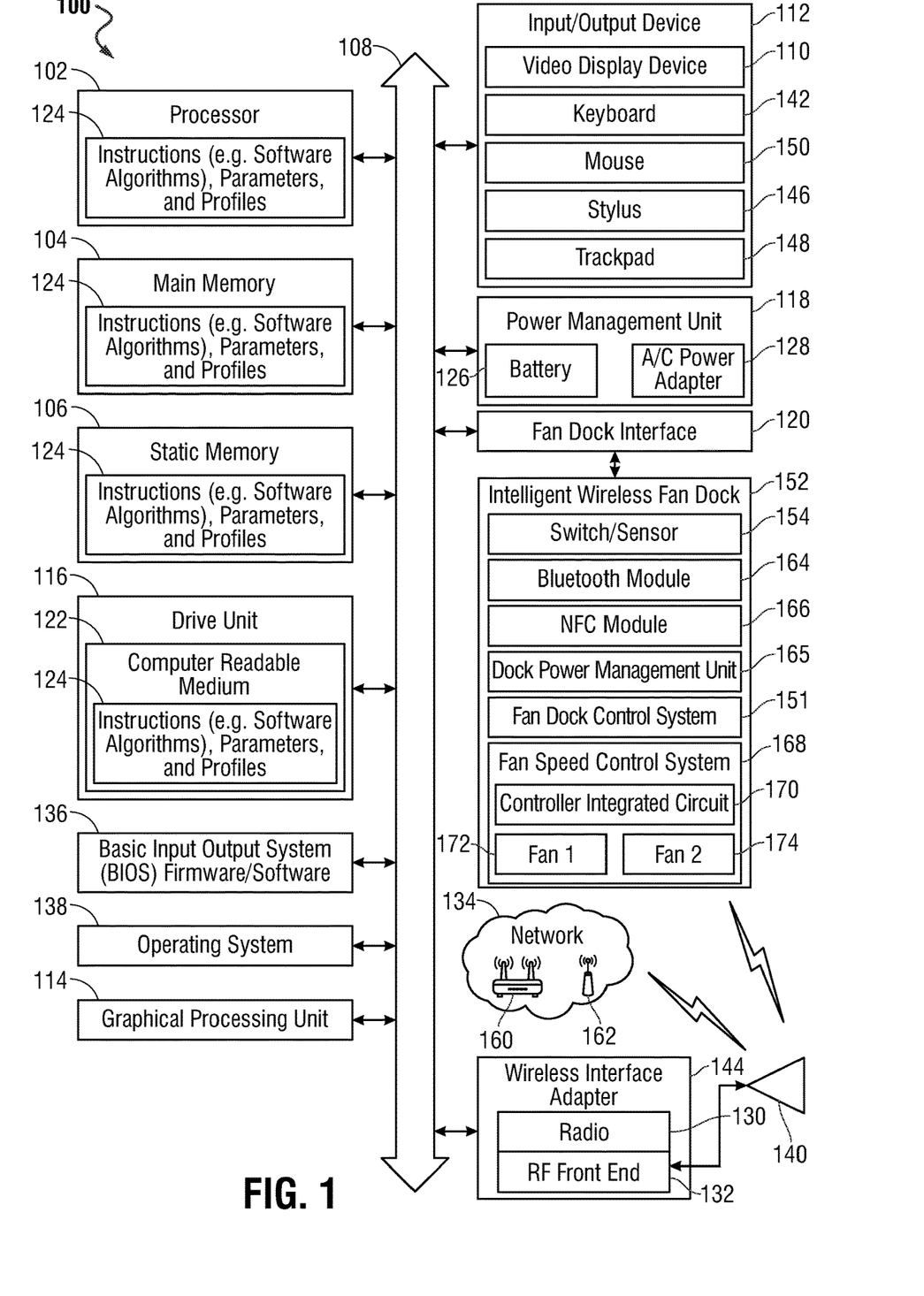
FIG. 1 is a block diagram illustrating an information handling system with an intelligent wireless fan docking system according to an embodiment of the present disclosure.

FIG. 1 illustrates an information handling system 100 similar to information handling systems according to several aspects of the present disclosure. In the embodiments described herein, an information handling system 100 includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 can be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a convertible laptop computer, a tablet computer, a desktop computer, a communications device, an access point (AP), a base station transceiver, a wireless telephone, a land-line telephone, a control system, a camera, a scanner, a printer, a personal trusted device, a web appliance, or any other suitable machine capable of executing a set of instructions (sequential or otherwise) that specify actions to be taken by that machine, and can vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the computer system 100 can be implemented using electronic devices that provide voice, video or data communication. For example, an information handling system 100 may be any mobile or other computing device capable of executing a set of instructions (sequential or otherwise) that specify actions to be taken by that machine. In an embodiment, the information handling system 100 may be operatively coupled to a server or other network device and provide data storage resources, processing resources, and/or communication resources as described herein. Further, while a single information handling system 100 is illustrated, the term "system" shall also be taken to include any collection of systems or sub-systems that individually or jointly execute a set, or multiple sets, of instructions to perform one or more computer functions.

The information handling system can include memory (volatile (e.g., random-access memory, etc.), nonvolatile (read-only memory, flash memory etc.) or any combination thereof), one or more processing resources, such as the processor 102, a central processing unit (CPU), a graphics processing unit (GPU) 114, accelerated processing unit (APU), a microprocessor, a microcontroller, a digital signal processor (DSP), a vision processing unit (VPU), an application specific integrated circuit (ASIC), a reduced instruction set computer (RISC), a complex instruction set computer (CISC), a super scalar processor, or any combination thereof. Any of the processing resources may operate to execute code that is either firmware or software code. Additional components of the information handling system 100 can include one or more storage devices such as a main memory 104, static memory 106, computer readable medium 122 storing instructions 124 of one or more software or firmware applications, and drive unit 116 (volatile (e.g., random-access memory, etc.), nonvolatile (read-only memory, flash memory etc.) or any combination thereof). In an embodiment, the information handling system 100 may include one or more communications ports for communicating with external devices, as well as various input and output (I/O) devices 112. The information handling system 100 can also include one or more buses 108 operable to transmit data communications between the various hardware components described herein. Portions of an information handling system 100 may themselves be considered information handling systems and some or all of which may be wireless.

Information handling system 100 can include devices or modules that embody one or more of the devices or execute instructions for the one or more systems and modules described above and operates to perform one or more of the methods described above. The information handling system 100 may execute code instructions 124 via one or more processing resources that may operate on servers or systems, remote data centers, or on-box in individual client information handling systems according to various embodiments herein. In some embodiments, it is understood any or all portions of code instructions 124 may operate on a plurality of information handling systems 100.

As shown, the information handling system 100 may further include a video display device 110. The video display device 110 in an embodiment may function as a liquid crystal display (LCD), an organic light emitting diode (OLED), a flat panel display, or a solid-state display. Additionally, the information handling system 100 may include one or more input/output devices 112 including an alpha numeric input device such as a keyboard 142 and/or a cursor control device, such as a mouse 150, touchpad/trackpad 148, a stylus 146, a handheld controller, or a gesture or touch screen input device associated with the video display device 110. In an embodiment, the video display device 110 may provide output to a user during operation of applications. In an embodiment, the information handling system 100 may be used by a user and operably coupled to an intelligent wireless fan dock 152, with the resources of the information handling system 100 providing processing resources, data storage resources, communication services that may have increase performance by utilizing the extended thermal control of a fan speed control system 168 and the cooling system of one or more fans 172, 174 in the intelligent wireless fan dock 152.

The intelligent wireless fan dock 152 may be linked wirelessly to the information handling system 100 via a wireless interface adapter 144 on the information handling system 100. The wireless linking may also be coordinated via a fan dock interface 120 in some embodiments where some portion of wired connection is also utilized such as for power supplied from the intelligent wireless fan dock 152 to the information handling system. In other embodiments, the fan dock interface 120 may include a near field communication (NFC) antenna which may be used to detect a docking event as well as for wireless connectivity for power or communication as operative coupling to the intelligent wireless fan dock 152 when the information handling system is docked. Other wireless protocols may also be used to operatively couple the intelligent wireless fan dock 152 and information handling system 100. The wireless interface adapter 144 may support a Bluetooth (BT) wireless link, an NFC wireless link or other wireless link from other protocols such as Wi-Fi or 5 G NR via radio 130, antenna 140, and radiofrequency front end 132 to be wirelessly coupled to a Bluetooth module 164, an NFC module 166 or other reciprocal radio module on the intelligent wireless fan dock 152. This may provide for a wireless link for communications between the information handling system 100 and a docked intelligent wireless fan dock 152. In another embodiment, the information handling system 100 may be operatively coupled to a network 134 via a wireless interface adapter 144 and any of several wireless protocols including one or more WLAN or WWAN wireless links.

The network interface device shown as wireless interface adapter 144 can provide connectivity to a network 134, e.g., a wide area network (WAN), a local area network (LAN), wireless local area network (WLAN), a wireless personal area network (WPAN), a wireless wide area network (WWAN), or other network. In an embodiment, the WAN, WWAN, LAN, and WLAN may each include an access point 160 or base station 162 used to operatively coupled the information handling system 100 to a network 134. In a specific embodiment, the network 134 may include macro-cellular connections via one or more base stations 162 or a wireless access point 160 (e.g., Wi-Fi), or such as through licensed or unlicensed WWAN small cell base stations 162. Connectivity may be via wired or wireless connection. For example, wireless network access points 160 or base stations 162 may be operatively connected to the information handling system 100. The wireless interface adapter 144 may include one or more radio frequency (RF) subsystems (e.g., radio 130) with transmitter/receiver circuitry, modem circuitry, one or more antenna front end circuits 132, one or more wireless controller circuits, amplifiers, antennas 140 and other circuitry of the radio 130 such as one or more antenna ports used for wireless communications via multiple radio access technologies (RATs). The radio 130 may communicate with one or more wireless technology protocols. In and embodiment, the radio 130 may contain individual subscriber identity module (SIM) profiles for each technology service provider and their available protocols for any operating subscriber-based radio access technologies such as cellular LTE communications.

In an example embodiment, the wireless interface adapter 144, radio 130, and antenna 140 may provide connectivity to a one or more of the peripheral devices that may include a wireless video display device 110, a wireless keyboard 142, a wireless mouse 150, an intelligent wireless fan dock 152, a microphone and speaker headset, a wireless stylus 146, and a wireless trackpad 148 among other wireless peripheral devices used as input/output (I/O) devices 112. Such wireless communications may be conducted in a variety of wireless protocols including a BT wireless protocol or an NFC wireless protocol as examples. In an embodiment, the intelligent wireless fan dock 152 may include a wireless radio and an antenna as part of a radio module, such as BT module 164 or NFC module 166, to wirelessly couple the intelligent wireless fan dock 152 to the information handling system 100 via its antenna 140 and radio 130. In an embodiment, the intelligent wireless fan dock 152 may operate with Bluetooth radio or NFC radio protocols. In other embodiments, the intelligent wireless fan dock 152 may operate with Wi-Fi 802.11 radio protocol, 5 G NR radio protocols, or other wireless protocols to operatively couple the intelligent wireless fan dock 152 to the information handling system 100 or to a network such as 134. In an embodiment, an antenna controller operatively coupled to an operating system (OS) 138 may operate to control transceiving data to and from the information handling system 100 or a combination of processors on these devices via the wireless interface adapter. This may include the antenna controller managing communications between the information handlings system 100 and the intelligent wireless fan dock 152 among one or more wireless protocols upon docking.

As described, the wireless interface adapter 144 may include any number of antennas 140 which may include any number of tunable antennas for use with the system and methods disclosed herein. Although FIG. 1 shows a single antenna 140, the present specification contemplates that the number of antennas 140 may include more or less of the number of individual antennas shown in FIG. 1 to accommodate plural wireless protocols as described herein. Additional antenna system modification circuitry (not shown) may also be included with the wireless interface adapter 144 to implement coexistence control measures via an antenna controller as described in various embodiments of the present disclosure.

The wireless interface adapter 144 can represent an add-in card, wireless network interface module that is integrated with a main board of the information handling system or integrated with another wireless network interface capability, or any combination thereof. In an embodiment the wireless interface adapter 144 may include one or more radio frequency subsystems including transmitters and wireless controllers for connecting via a multitude of wireless links. In an example embodiment, an information handling system 100 may have an antenna system transmitter for 5 G small cell WWAN, Wi-Fi WLAN connectivity and one or more additional antenna system transmitters for macro-cellular communication. The RF subsystems and radios 130 include wireless controllers to manage authentication, connectivity, communications, power levels for transmission, buffering, error correction, baseband processing, and other functions of the wireless interface adapter 144.

During operation, the information handling system 100 may communicate with the intelligent wireless fan dock 152 either via a wired connection, wirelessly, or some combination as described herein. The operation of the intelligent wireless fan dock 152 may operate and be controlled in coordination with the information handling system 100 operation when docked, in an embodiment intelligent wireless fan dock 152 may be operatively coupled via a BT wireless coupling of BT module 164, an NFC wireless coupling via NFC module 166, or another wireless link in an embodiment. A fan dock control 151 may have code executing on a processor, embedded controller, power management or thermal management controller or other in the information handling system 100. The fan dock control system 151 may be computer readable code instructions executing on the information handling system to monitor for an indication of docking as detected by either the intelligent wireless fan dock 152 or the information handling system 100. The fan dock control system 151 may coordinate, when wirelessly or otherwise coupled, with the fan speed control system 168 and controller integrated circuit 170 or other processing resource on the intelligent wireless fan dock 152.

In an example embodiment, a mechanical switch, electrical switch, capacitive sensor, resistive sensor, hall effect sensor, ambient or infrared light sensor, or other sensor may be used as switch sensor 154 on the intelligent wireless fan dock 152 to detect when a docking event has occurred between the information handling system and the intelligent wireless fan dock 152. It is contemplated that a similar switch/sensor may be utilized on the information handling system 100 instead or in addition. In another embodiment, NFC module 166 may be used within the intelligent wireless fan dock 152 to detect the docking of the information handling system as a docking event.

When the docking event is sensed, the controller integrated circuit 170 or other controller or processing resource on the intelligent wireless fan dock 152 may wirelessly couple the intelligent wireless fan dock 152 to the information handling system as described. In some embodiments, a wired coupling between the information handling system 100 at a fan dock interface 120 and intelligent wireless fan dock 152 may be provided by the docking action to provide power, communications, or other connectivity in some embodiments. Such a wired coupling may also be manual by a user via a cable or wire. A dock power management unit 165 may control power to the intelligent wireless fan dock 152 and fans such as Fan 1 172 or Fan 2 174. It is contemplated that any number of fans may be integrated and controlled individually or concurrently in the intelligent wireless fan dock 152 via the fan speed control system 168 in various embodiments.

Upon wireless coupling in an embodiment, the fan dock control system 151 may execute one or more methods herein of coordination of control of the intelligent wireless fan dock 152 and operation of fan 1 172 and fan 2 174 with altering operation of systems and power limits within the information handling system based on monitoring of one or more heat producing components and execution of software applications 124 on the information handling system. In some embodiments, a partial or whole wired coupling between the information handling system 100 and intelligent wireless fan dock 152 may similarly result in coordination of extended fan capacity control with monitoring of components and software in the information handing system in accordance with additional performance and expanded power limits available to a docked information handling system 100. According to embodiments herein, the fan dock control system 151 may provide for an increased performance mode for the information handling system and also may relax maximum power draw limitations to one or more heat producing components in the information handling system in coordination with the power management unit 118 to allow greater power draw to assist operation of the component such as for processing or wireless transmission. Additional heat production is offset by the extended cooling airflow capacity that may be provided by the intelligent wireless fan dock 152. The fan dock control system 151 on the information handling system and the fan speed control system 168 on the intelligent wireless fan dock 152 may execute this coordination and control according to the methods and embodiments of the present disclosure.

The information handling system 100 can include a set of instructions 124 that can be executed to cause the computer system to perform any one or more of the methods or computer-based functions disclosed herein. For example, instructions 124 may execute the fan dock control system 151, operating system 138, basic input output system (BIOS) 136, various software applications, software agents, or other aspects or components. Various software modules comprising application instructions 124 may be coordinated by an operating system (OS) 138, BIOS 136, and/or via an application programming interface (API). An example OS 138 may include Windows®, Android®, and other OS types known in the art. Example APIs may include Win 32, Core Java API, or Android APIs. Instructions of firmware or software may also execute a fan speed control system 168 and other functions on the intelligent wireless fan dock 152, such as via controller integrated circuit 170 or other dock processing resources, according to various embodiments herein.

The disk drive unit 116 and may include a computer-readable medium 122 in which one or more sets of instructions 124 such as software can be embedded to be executed by the processor 102 such as a CPU, or other processing resources such as processing resource 165 to perform the methods described herein. Similarly, main memory 104 and static memory 106 may also contain a computer-readable medium for storage of one or more sets of instructions, parameters, or profiles 124 described herein. The disk drive unit 116 or static memory 106 also contain space for data storage. The intelligent wireless fan dock 152 may also have memory according to embodiments herein. For example, the intelligent wireless fan dock 152 may include read only memory (ROM) to store computer readable code instructions of the fan speed control system 168 in an embodiment. The dock fan speed control system 168 code instructions may be executed by the controller integrated circuit 170 to control the fan or fans 172, 174. Further, the instructions 124 may embody one or more of the methods or logic as described herein. In a particular embodiment, the instructions, parameters, and profiles 124 may reside completely, or at least partially, within the main memory 104, the static memory 106, and/or within the disk drive 116 during execution by the processor 102 or GPU 114 of information handling system 100 or processing resource, and the controller integrated circuit 170 or other controller or processor of intelligent wireless fan dock 152. The main memory 104, static memory 106, or other memory according to embodiments herein may serve as computer-readable media for processing resources such as processor 102, GPU 114, or processing resources on the intelligent wireless fan dock 152 such as controller integrated circuit 170.

Main memory 104 or other memory of the embodiments described herein may contain computer-readable medium (not shown), such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The computer executable program code describing the fan dock control system 151 may be stored on the static memory 106, the drive unit 116, or other memory of the information handling system. The computer executable program code describing the fan speed control system 168 may be stored in static memory or other memory of intelligent wireless fan dock 152 and may include access to a computer-readable medium 122 such as a flash memory or read only memory (ROM) in an example embodiment. While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that can store, encoding, or carrying a set of instructions for execution by a processor or that cause a computer system to perform any one or more of the methods or operations disclosed herein.

In an embodiment, the information handling system 100 may further include a power management unit (PMU) 118 (a.k.a. a power supply unit (PSU)). The PMU 118 may manage the power provided to the components of the information handling system 100 such as the processor 102, a cooling system, one or more drive units 116, a graphical processing unit (GPU), a video/graphic display device 110 or other input/output devices 112, and other components that may require power when a power button has been actuated by a user. In an embodiment, the PMU 118 may monitor power levels and be electrically coupled, either wired or wirelessly, to the information handling system 100 to provide this power and coupled to bus 108 to provide or receive data or instructions. The PMU 118 monitor power levels or power provided to components as well as monitor heat levels of components or information handling system skin temperature levels in an embodiment. Such power levels may be subject to reference to a thermal table for each type of information handling system such as set by a manufacturer for limitations and control on current draw, voltage levels, and anticipated heat production for components of the information handling system including heat producing components. This thermal table and the PMU 118 may coordinate to protect components from excessive heat levels as well as control skin surface temperature levels to protect users from discomfort or injury. In an embodiment, this thermal table may include adjusted levels of operation, power draw limits, and heat production levels relevant when extended cooling airflow is made available via docking with an intelligent wireless fan dock 152. The monitoring of power levels in accordance with power limits for components as well as monitoring heat levels and heat limits by the PMU 118 may be provided to the fan dock control system 151. In one embodiment, the fan dock control system 151 may be firmware or software executed in whole or in part by a controller or other processing resource of the PMU 118. The fan dock control system 151 may provide for relaxed power limits for one or more components based upon docking of the information handling system and operation capacity for cooling that is available and adjustable with the fans 172, 174 of the intelligent wireless fan dock 152.

The PMU 118 may be coupled to the antenna controller to control the wireless radio 130 of the information handling system 100 as described herein. The PMU 118 may regulate power from a power source such as a battery 126 or A/C power adapter 128. In an embodiment, the battery 126 may be charged via the A/C power adapter 128 and provide power to the components of the information handling system 100 via a wired connections as applicable, or when A/C power from the A/C power adapter 128 is removed. PMU 118 may further regulate power for charging battery 126 via an A/C power adapter 126 that may be operatively coupled to the intelligent wireless fan dock 152 for power. In one embodiment, the power coupling between the information handling system 100 and the intelligent wireless fan dock 152 may be by a wire or a power pin. In another embodiment, intelligent wireless fan dock 152 may be coupled to the information handling system 100 via the NFC module 166 which may provide for a wireless inductive power supply coupling via an inductive coil antenna with a reciprocal wireless inductive coil on the information handling system 100 such as with an antenna 140 or the fan dock interface 120. The PMU 118 will regulate charging of battery 126 and power source operation as with the power adapter 126 via such a wireless inductive power coupling.

A similar dock PMU 165 with a battery or A/C power source may be provided for the intelligent wireless fan dock 152 in various embodiments herein and similarly monitor and control power to the components of the intelligent wireless fan dock 152 and power provided to drive the integrated fans 172, 174.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

In various embodiments, dedicated hardware implementations such as application specific integrated circuits (ASICs), programmable logic arrays and other hardware devices can be constructed to implement one or more of the methods described herein and serve as controller integrated circuit 170 or other processing resource in the intelligent wireless fan dock 152. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

When referred to as a "system", a "device," a "module," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCM-CIA) card, or other such expansion card), or a system (such as a motherboard, a system-on-a-chip (SoC), or a stand-alone device). The system, device, controller, or module can include software, including firmware embedded at a device, such as an Intel® Core class processor, ARM® brand processors, Qualcomm® Snapdragon processors, or other processors and chipsets, or other such device, or software capable of operating a relevant environment of the information handling system. The system, device, controller, or module can also include a combination of the foregoing examples of hardware or software. Note that an information handling system can include an integrated circuit or a board-level product having portions thereof that can also be any combination of hardware and software. Devices, modules, resources, controllers, or programs that are in communication with one another need not be in continuous communication with each other, unless expressly specified otherwise. In addition, devices, modules, resources, controllers, or programs that are in communication with one another can communicate directly or indirectly through one or more intermediaries.

Figure 2A:
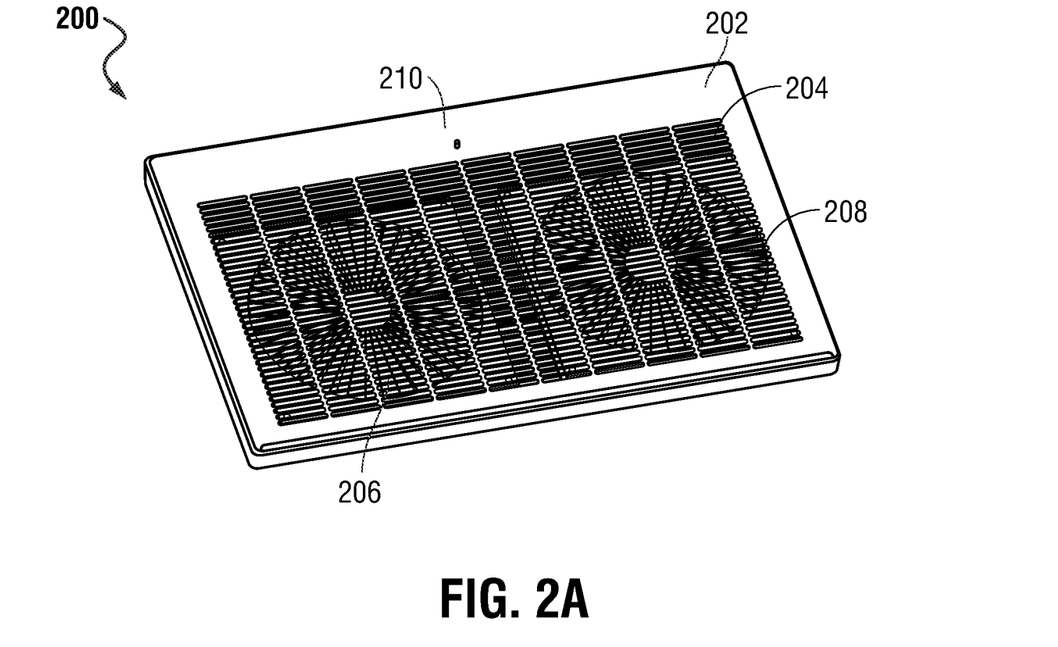
FIG. 2A is a graphic diagram top perspective view of an intelligent wireless fan docking system according to an embodiment of the present disclosure.
Figure 2B:
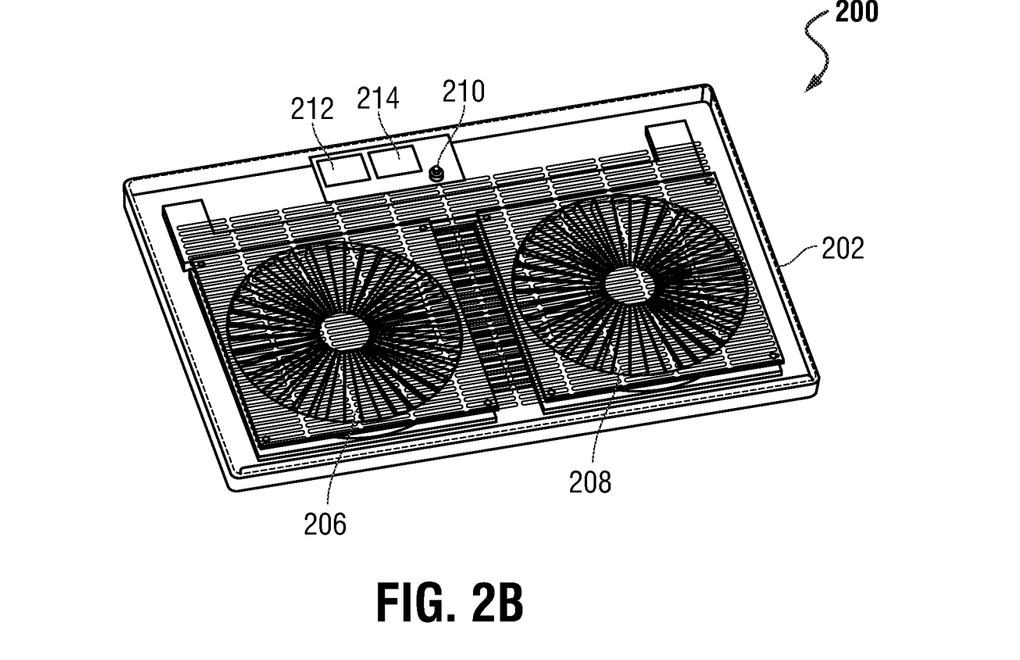
FIG. 2B is a graphic diagram top perspective cutaway view of an intelligent wireless fan docking system according to an embodiment of the present disclosure.

FIG. 2A and FIG. 2B illustrate top perspective views of an intelligent wireless fan dock 200 that can include one or more fans 206 and 208 according to an embodiment herein. The intelligent wireless fan dock 200 may be operatively coupled, including wirelessly coupled, to one or more information handling systems as discussed in embodiments herein.

FIG. 2A shows a top perspective view of an intelligent wireless fan dock 200 according to an embodiment. The intelligent wireless fan dock 200 includes a fan dock housing 202 with a vent 204 to permit airflow from within intelligent wireless fan dock 200 according to embodiments herein. The fan dock housing 202 further includes a switch or other sensor 210 on the top of the fan dock housing 202 to detect when an information handling system (not shown) is docked to the intelligent wireless fan dock 200. Inside of the vent louvers 204 can be seen two fans, fan 1 206 and fan 2 208.

FIG. 2B shows a cutaway top perspective view of the intelligent wireless fan dock 200 according to an embodiment. The intelligent wireless fan dock 200 shows the top portion of the fan dock housing 202 and a vent cutaway to show components internal to the intelligent wireless fan dock 200. The components internal to the fan dock housing 202 includes printed circuit board with the switch or other sensor 210 mounted thereon in an embodiment. In one embodiment, the switch or other sensor 210, is a mechanical contact switch. In another embodiment, switch or sensor 210 may include an electrical switch, capacitive sensor, resistive sensor, a hall sensor, a light sensor, or other sensor to detect when an information handling system (not shown) is docked. For example, an electrical switch may be triggered if the docking involves, in some part, a wired coupling such as for power or communications. Further, the printed circuit board includes a BT module integrated circuit 212 which may have additional systems such as a BT antenna and front end located on the integrated circuit or remotely within the intelligent wireless fan dock 200 in various embodiments. Further, the integrated circuit 212 or a separate integrated circuit (not shown) may include an NFC module for detection of a docked information handling system with a reciprocal NFC system and for one or more other wireless links between the intelligent wireless fan dock 200 and a docked information handling system.

Inside the intelligent wireless fan dock 200 are one or more fans to provide extended cooling capacity for a docked information handling system such as fan 1 206 and fan 2 208. Controller integrated circuit 214 or other processing resource may operate the fan speed control system to control speed and air capacity of the fans 206, 208 of the intelligent wireless fan dock 200 to support the thermal requirements of a docked information handling system. Upon wireless or other coupling of an information handling system, the fan speed control system may coordinate with a fan dock control system on the information handling system to determine control of fan speeds of fans 206, 208. The fan speed control system may access a thermal table for the docked information handling system in a docked state and monitor operation of information handling system components and executing software to determine control the fan speeds for fans 206, 208 in the intelligent wireless fan dock 200.

In an intelligent wireless fan dock 200 of embodiments herein with more than one fan, fan locations may align or be coordinated with zones or portions of a docked information handlings system across the footprint of the information handling system where one or more particular heat producing components are located. For example, heat producing components may include a CPU, GPU, other processor, 5 G NR radio, power system or the like. In the shown embodiment, the left fan 1 206 may provide additional cooling more directly to a location or zone for a CPU located on a left-side of a docked information handling system. In another example embodiment, the right fan 2 208 may provide additional cooling more directly to a location for a GPU or a 5 G NR radio system located on a right side of a docked information handling system. It is appreciated that any left or right location of heat producing components such as a CPU, GPU, 5 G NR radio system or other may be part in varying footprints of a variety of information handling systems that may be docked to the intelligent wireless fan dock 200. The coupling of a docked information handling system to the intelligent wireless fan dock 200 may provide the type of information handling system and the locations or zones of such heat producing components relative to the plural fans as built into the wireless intelligent fan dock. In an example embodiment, a thermal table for the detected information handling system that has docked may provide information for the fan speed control system intelligent wireless fan dock 200 to provide additional power to one fan location or another based on the type of docked information handling system. The fans in the intelligent wireless fan dock 200 may be coordinated with the fan dock control system on the information handling system according to embodiments herein and may dynamically vary depending on types of applications running or levels of operation anticipated or detected for heat producing components.

Figure 3A:
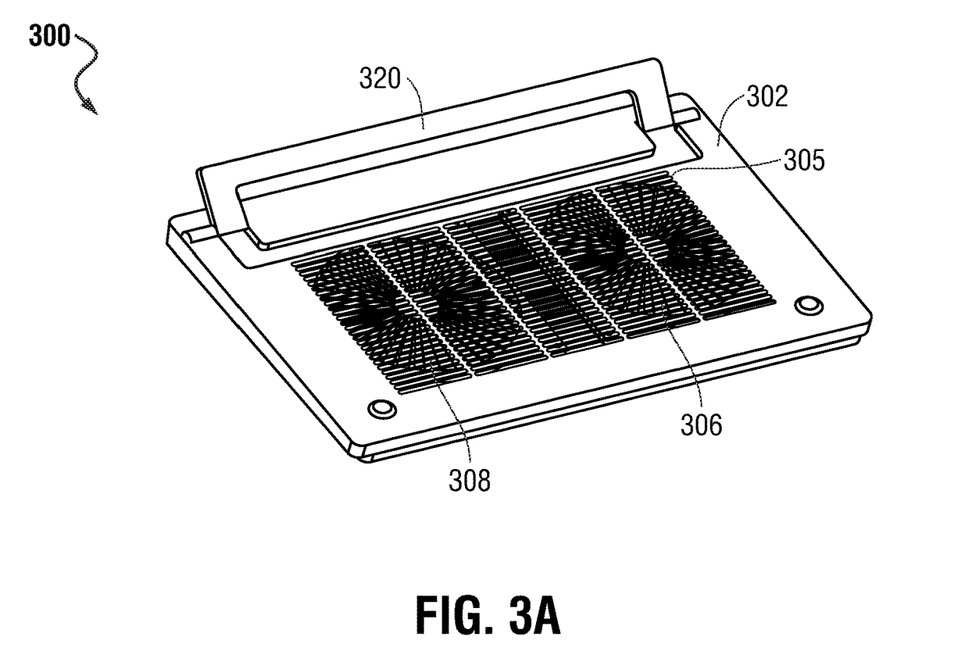
FIG. 3A is a graphic diagram bottom perspective view of an intelligent wireless fan docking system according to an embodiment of the present disclosure.
Figure 3B:
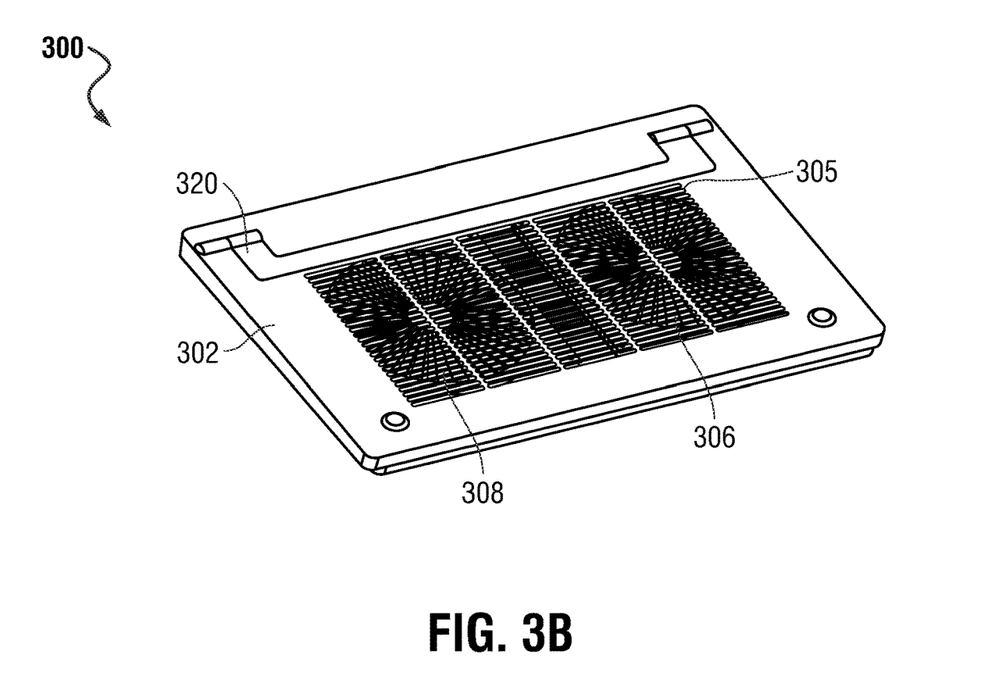
FIG. 3B is a graphic diagram bottom perspective cutaway view of an intelligent wireless fan docking system according to another embodiment of the present disclosure.

FIG. 3A and FIG. 3B illustrate bottom perspective views of an intelligent wireless fan dock 300 that can include one or more fans 306 and 308 according to an embodiment herein. The intelligent wireless fan dock 300 may be operatively coupled, including wirelessly coupled, to one or more information handling systems as discussed in embodiments herein.

FIG. 3A shows a bottom perspective view of an intelligent wireless fan dock 300 according to an embodiment. The intelligent wireless fan dock 300 includes a fan dock housing 302 with a bottom vent 305 to permit airflow of cool air into the intelligent wireless fan dock 300 according to embodiments herein. The fan dock housing 302 further includes a table stand 320 that is hinged and may fold into the bottom of the fan dock housing 302 to provide a preferred docking orientation when an information handling system (not shown) is docked to the intelligent wireless fan dock 300. Inside of the vent louvers 305 can be seen two fans, fan 1 306 and fan 2 308.

FIG. 3B shows the bottom perspective view of an intelligent wireless fan dock 300 according to another embodiment. The intelligent wireless fan dock 300 includes the bottom portion of the fan dock housing 302, a vent 305 with fans 306, 308 as in FIG. 3A. The fan dock housing 302 further includes a table stand 320 that is hinged shown folded into the bottom of the fan dock housing 302 when not used.

Figure 4:
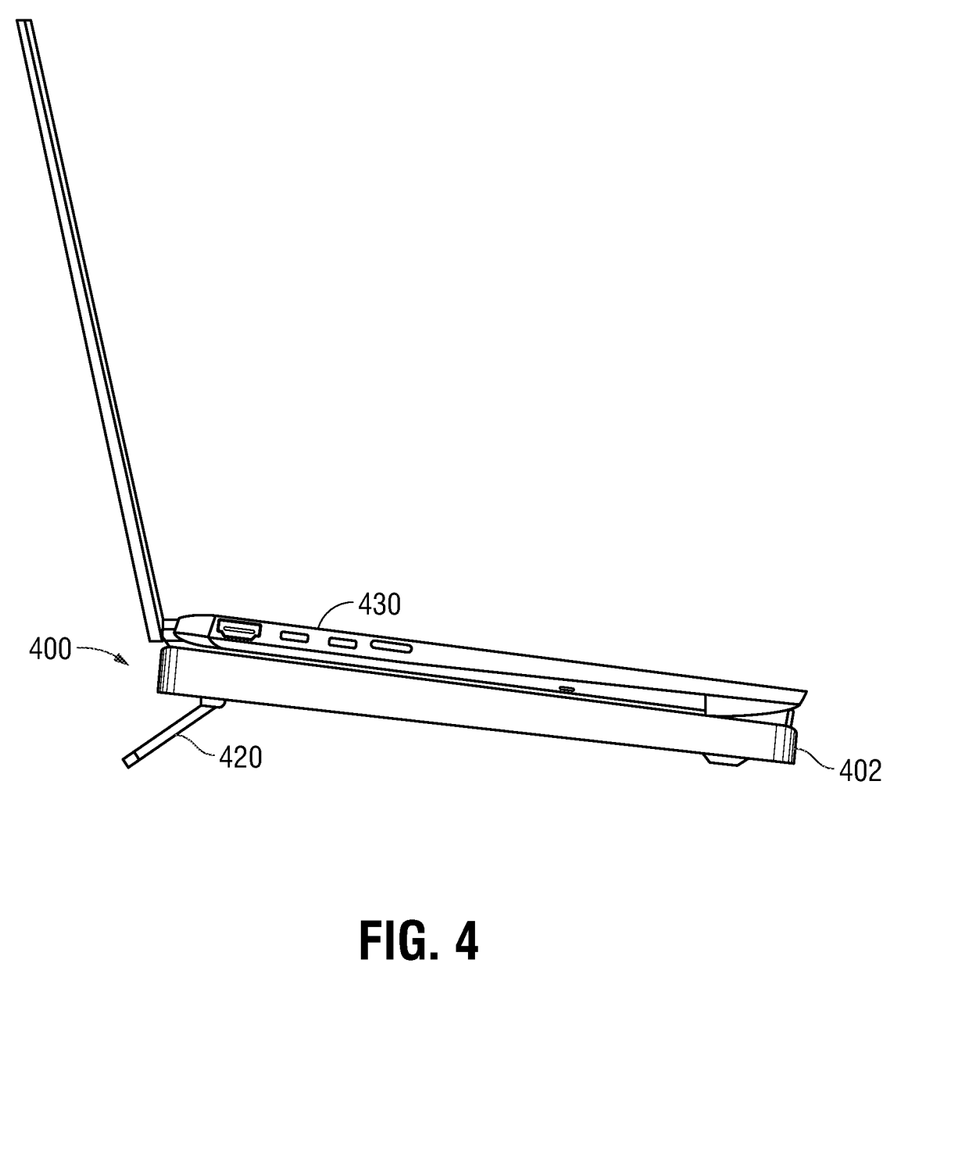
FIG. 4 is a graphic diagram side perspective view of an intelligent wireless fan docking system with a docked information handling system according to an embodiment of the present disclosure.

FIG. 4 shows a side perspective view of an intelligent wireless fan dock 400 with an information handling system 430 docked according to an embodiment. The intelligent wireless fan dock 400 includes a fan dock housing 402 with a top portion operatively coupled to information handling system 430 resting thereon. As can be appreciated, airflow from the fans of the intelligent wireless fan dock 400 may be directed upwards into the base housing of the information handling system to provide extended fan capacity of cool air via the intelligent wireless fan dock 400 according to embodiments herein. The fan dock housing 402 further includes a table stand 420 that is hinged and may fold into the bottom of the fan dock housing 402. Table stand 420 is shown extended to provide a preferred docking orientation for viewing or use of the information handling system 430 docked to the intelligent wireless fan dock 400. The location of the fans of the intelligent wireless fan dock 400 may be variously controlled to provide additional vent fan capacity under one or more heat producing components in the base chassis of the information handling system 430. For example, a left fan may provide additional cooling more directly to a location for a CPU location where a right fan may provide additional cooling more directly to a location for a GPU or a 5 G NR radio system in an embodiment. The thermal table or operating conditions such as activity of components or anticipated activity based on executing software application types monitored on the information handling system 430 may provide information for the fan speed control system intelligent wireless fan dock 400 at a fan speed control system to provide additional power to one fan location or another based on the type of docked information handling system 430. This thermal table and direction of fan airflow control among fans in the intelligent wireless fan dock 400 may be coordinated with the fan dock control system on the information handling system 430 and control may be based on power or thermal monitoring there as well as types of applications running. Fan location on the intelligent wireless fan dock 400 may be matched or coordinated with location of any heat producing components on the information handling system 430 base chassis in various embodiments. Thus, control of the intelligent wireless fan dock 400 among fans thereon may depend on the detected model of information handling system 430 docked in various embodiments herein.

Figure 5A:
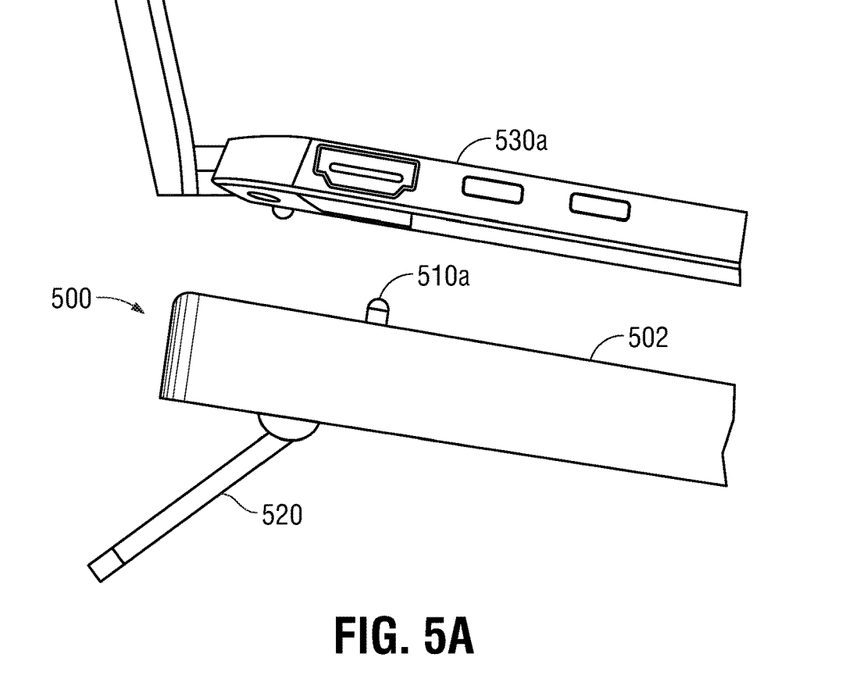
FIG. 5A is a graphic diagram side perspective view of an intelligent wireless fan docking system with an information handling system in an undocked state according to an embodiment of the present disclosure.
Figure 5B:
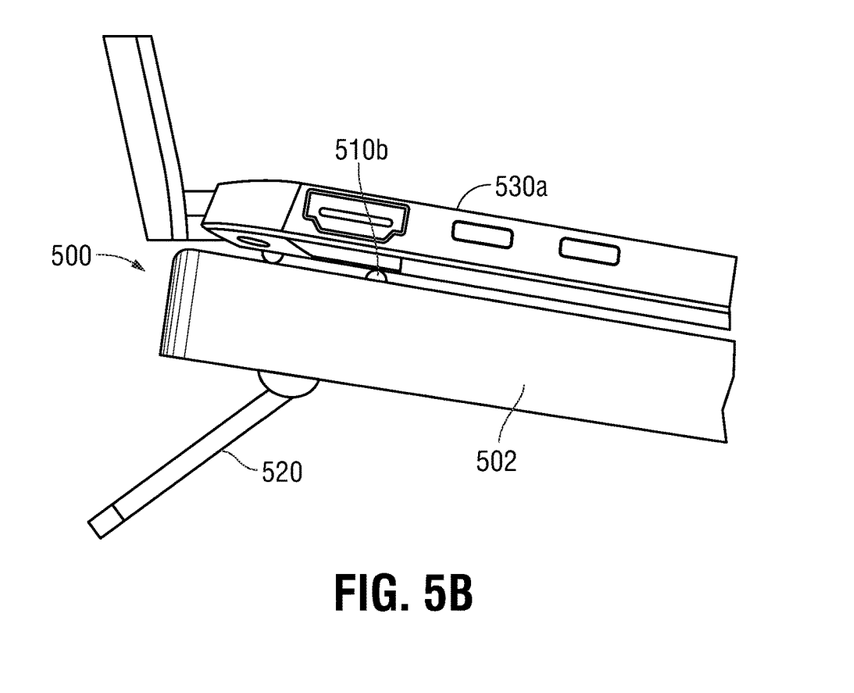
FIG. 5B is a graphic diagram side perspective view of an intelligent wireless fan docking system with an information handling system in a docked state according to an embodiment of the present disclosure.

FIG. 5A and FIG. 5B show a close-up, side perspective view of an intelligent wireless fan dock 500 with an information handling system 530a or 530b in an undocked and docked state according to an embodiment. The intelligent wireless fan dock 500 includes a fan dock housing 502 with a top portion to be operatively coupled to an information handling system 530b resting thereon. A bottom surface of the information handling system 530b may rest on the top portion of fan dock housing 502 in an embodiment over venting in the top surface such that upward cooling airflow from one or more fans in intelligent wireless fan dock 500 may flow to the information handling system 530b. The fan dock housing 502 further includes a table stand 520 that is hinged and may fold into the bottom of the fan dock housing 502. Table stand 520 is shown extended to provide a preferred docking orientation for viewing or use of the information handling system 530b docked to the intelligent wireless fan dock 500.

In FIG. 5A, the information handling system 530a in in a first position and has yet to be docked to intelligent wireless fan dock 500. The intelligent wireless fan dock 500 includes a switch or sensor 510a, in the shown embodiment as an extended mechanical switch, extending from a mounting through the top surface of the fan dock housing 502. The extended position of the switch or sensor 510a indicates to the controller of the intelligent wireless fan dock 500 that no information handling system has been docked. Other docking sensors are contemplated according to various embodiments herein. As such, with no information handling system 530a yet docked, the wireless link between the information handling system 530a and the intelligent wireless fan dock 500 will yet be established. Further, fan control of one or more fans and airflow from the fans of the intelligent wireless fan dock 500 will yet begin or be coordinated with the operation of the information handling system 530a.

In FIG. 5B, the information handling system 530b is in a second position and is docked to intelligent wireless fan dock 500. The intelligent wireless fan dock 500 includes the switch or sensor 510b, in the shown embodiment as a mechanical switch in a compressed orientation and compressed further into the top surface of the fan dock housing 502. The compressed position of the switch or sensor 510b indicates to the controller of the intelligent wireless fan dock 500 that an information handling system has been docked. Other docking sensors are contemplated according to various embodiments herein. As such, with the information handling system 530b docked, the wireless link between the information handling system 530b and the intelligent wireless fan dock 500 will be established via a wireless link in an embodiment. A wireless link such as a BT wireless, an NFC wireless, some combination, or other wireless link may be used with corresponding radio modules in both the intelligent wireless fan dock 500 and information handling system 530b according to various embodiments herein. In one embodiment, a wireless power coupling is established via an NFC inductive transmitting power coil in the intelligent wireless fan dock 500 and an NFC inductive receiving power coil in the information handling system 530b. The relatively close proximity when the information handling system 530b is docked allows for wireless charging to occur. In another embodiment a wired or connector power connection may be established between the intelligent wireless fan dock 500 and the information handling system 530b. For example, mechanical switch 510b may interface and connect with a power interface receiver (not shown) on the information handling system 530b in an embodiment. In another embodiment, a power cable, such as from intelligent wireless fan dock 500 to a USB or other port as shown on the information handling system 530b may be coupled.

Upon detection of a docking event with a docking switch or sensor 510b, fan control of the one or more fans and airflow from the fans of the intelligent wireless fan dock 500 will commence and be coordinated with the operation of the information handling system 530b as detected and monitored by the fan dock control system operating thereon and in accordance with a thermal table indicating performance adjustments and power limitations available to the information handling system 530b that is detected as docked to the intelligent wireless fan dock 500. Control of fan speed control on the wireless intelligent fan dock 500 may dynamically vary depending on types of applications running or levels of operation anticipated or detected for heat producing components on information handling system 530b as described in embodiments herein.

Figure 6:
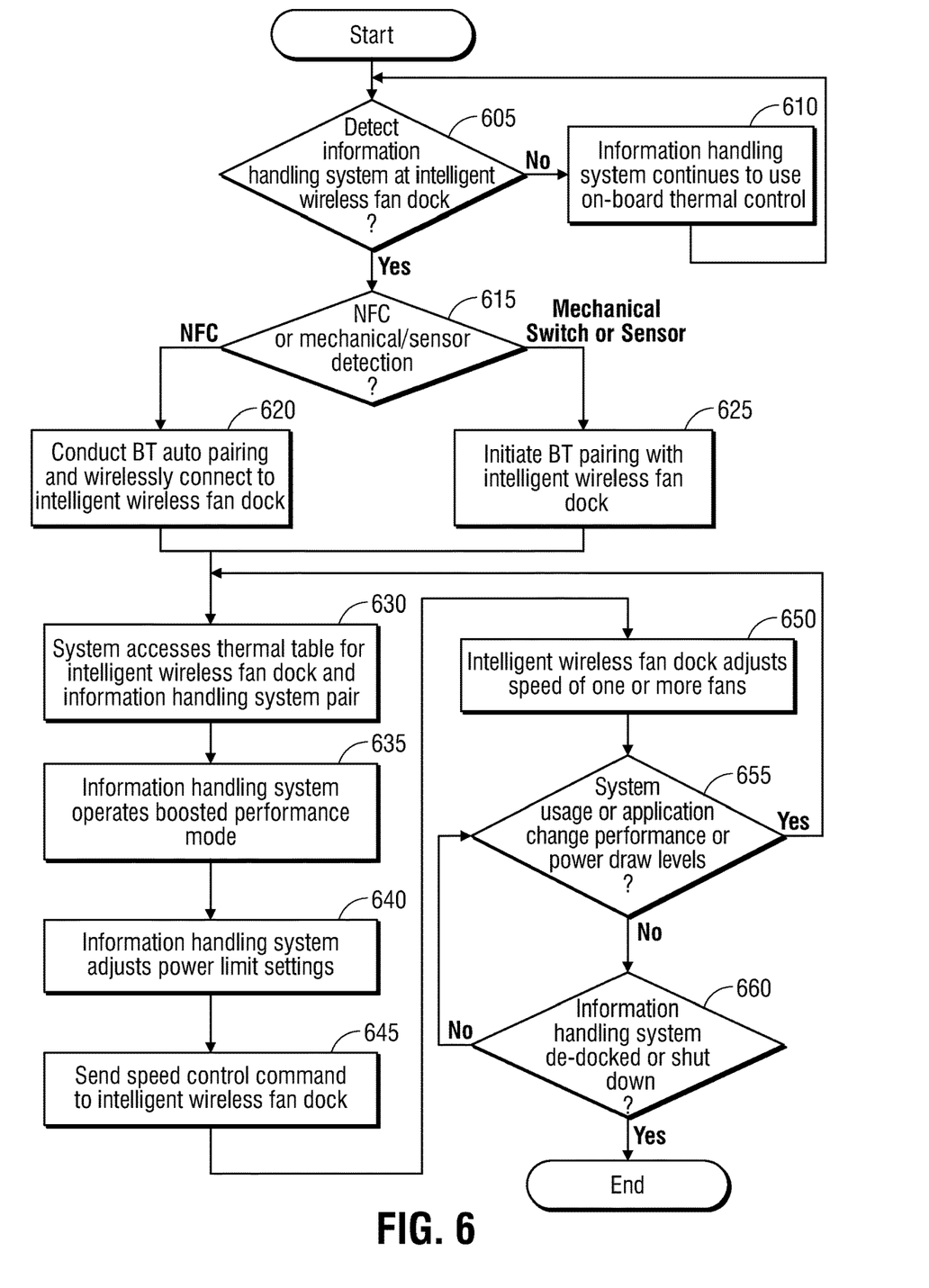
FIG. 6 is a flow diagram illustrating a method of control adjustments to an intelligent wireless fan docking system and for a docked information handling system according to an embodiment of the present disclosure.

FIG. 6 is a flow diagram illustrating a method of control adjustments with a fan dock control system for fan control at an intelligent wireless fan dock and coordinated for a detected, coupled information handling system docked thereto according to embodiments of the present disclosure. In an embodiment, a processor, controller, embedded controller, PMU controller or other processing resource may execute code instructions of a fan dock control system for some or all of the method steps at a mobile information handling system that is or may be docked to the intelligent wireless fan dock. In another embodiment, some or all of the method may be executed by a fan speed control system and a controller at an intelligent wireless fan dock and in coordination with any control systems at the docked information handling system.

The method may begin at block 605 where a switch or other sensor mounted on the intelligent wireless fan dock, the docking information handling system, or both may detect whether the information handling system is docked on the intelligent wireless fan dock. In example embodiments of the present disclosure, the switch or sensor may be a mechanical switch, an electronic switch, a hall effect sensor, a capacitive sensor, a resistive sensor, an IR or light sensor or other sensor that may detect the presence of an information handling system being docked to the intelligent wireless fan dock. The sensor may, in some embodiments, be an NFC module and antenna on the intelligent wireless fan dock detecting a reciprocal NFC radio on a docking information handling system. The switch or sensor may operate to detect the presence of the information handling system as understood by those of skill in the art and may further operate according to various embodiments herein.

If no information handling system is detected as docked to the intelligent wireless fan dock at block 605, flow may proceed to block 610 where the information handling system will continue to use on-board thermal systems and settings to operate with running software applications according to performance and thermal limits on various components therein. Flow may return to block 605 for continued monitoring for a docking event.

If an information handling system is detected as docked to the intelligent wireless fan dock at block 605, flow may proceed to block 615 where the controller of the intelligent wireless fan dock will determine whether an NFC detection was made or a mechanical switch or other sensor system or switch detects the docked information handling system in an optional embodiment. In other embodiments, such as with pre-pairing via a Bluetooth protocol or a wired communication link. The method may establish a wireless link or wired communication link at 615 and flow to block 630. In the shown embodiment, when an NFC module at the intelligent wireless fan dock detects docking of an information handling system having a reciprocal NFC wireless system, flow proceeds to block 620. At block 620, when an NFC wireless link is established and determines that the information handling system is docked, the intelligent wireless fan dock may use its NFC radio module to auto pair the BT radio module with the BT radio system of the docked information handling system. In some embodiments, the system may require that the BT radio module of the intelligent wireless fan dock and the docked information handling system have been paired before in some embodiments. In other embodiments, the NFC module may utilize the automatic pairing due to proximity to exchange pairing information between the intelligent wireless fan dock and the docked information handling system.

The BT auto-pairing at block 620 may also be triggered by other sensor in some embodiments where a sensor system involves detection of the docking at both the intelligent wireless fan dock and the docked information handling system. For example, a hall effect sensor, resistive sensor, or other sensors may detect the docking event at both the intelligent wireless fan dock and the docked information handling system. If the docked information handling system had been previous BT paired, the auto-pairing step of 620 may be triggered. In yet another embodiment, if a docked information handling system and the intelligent wireless fan dock have been previously paired and both have BT radios operating, the auto-pairing step of block 620 may occur as well.

When a mechanical switch or other sensor system or switch in the intelligent wireless fan dock detects the docked information handling system and no auto-pairing occurs or is available, the flow may proceed to block 625. At block 625, the intelligent wireless fan dock may establish a BT pairing procedure between the docked information handling system and the intelligent wireless fan dock.

As described herein, upon docking the information handling system in some embodiments a physical or wired or inductive wireless coupling may occur to the intelligent wireless fan dock for power supply or even for communications in some optional embodiments. In such embodiments, BT pairing may be unnecessary. Further, in other embodiments, a secure wireless link may be established at block 620 or 625 utilizing another wireless protocol or future wireless protocol that may have no pairing requirement or a seamless pairing capacity according to some embodiments herein. Upon establishing a wireless link via pairing or otherwise, or upon establishing a wired link at 620 or 625 between the docked information handling system and the intelligent wireless fan dock, flow may proceed to block 630.

The method may further include, at block 630, detecting the type of information handling system and intelligent wireless fan dock pair and accessing thermal table indicating various modes of performance levels for processors such as the CPU or GPU or performance levels for other heat producing components such as a 5 G NR radio or power systems. The thermal table may also have allowable power limits permitted by a PMU for power supplied to one or more heat producing components. Further, the thermal table may include adjustments to the above performance levels or power limits based on the operative coupling to an intelligent wireless fan dock control system and the added thermal control or cooling capacity provided by the same. The thermal control tables may be established by information handling system manufacturers to determine safe operation limits and performance limits in view of monitored internal heating of heat producing components or skin surface temperature limits of information handling systems to protect users from discomfort or injury. The thermal control table may provide, or other data may also be provided by the operatively coupled information handling system, relating to layout of heat producing components vis a vis the fan layout of the intelligent wireless fan dock. Upon accessing a thermal table for the information handling system type detected and the intelligent wireless fan dock, flow may proceed to block 635 with operation of a fan dock control system at the information handling system as well as the fan speed control system at the intelligent wireless fan dock to coordinate the fan speeds and operation at the intelligent wireless fan dock with operations of the docked information handling system.

At block 635, the information handling system may access the thermal table and determine that with the docking to the intelligent wireless fan dock, the thermal table permits an enhanced performance mode of one or more processors, a 5 G NR radio, or other heat producing component. Accordingly, the fan dock control system may notify the PMU and the processors or a wireless controller for the 5 G NR radio or other radio of this added performance capacity. The fan dock control system will also receive as inputs the current operational levels of heat producing components as well as indications of the software or software types executing on the information handling system in an embodiment.

In one example, the fan dock control system may determine that a GPU on the information handling system is operating at a high level or that a gaming application is executing on the information handling system. Thus, the fan dock control system may determine greater performance may be used with the GPU and additional power supplied thereto in an embodiment. This may also result in a dynamic fan speed request command to the intelligent wireless fan dock that a first fan, among a plurality of fans therein, that is situated under or near the location or zone of the GPU on the docked information handling system may be increased in fan speed to provide additional cooling over the other fan or fans operation to cool the docked information handling system in one embodiment.

In another example embodiment, the fan dock control system may determine that a 5 G NR radio on the information handling system is operating at a high level or that a video conferencing application is executing that is 5 G NR radio intensive or intensively using another radio on the information handling system. Thus, the fan dock control system may determine greater performance may be used with the 5 G NR radio or other radio and additional power supplied thereto in an embodiment. This may also result in a dynamic fan speed request command to intelligent wireless fan dock that a fan that is situated under or near the location of the 5 G NR may be increased in fan speed to provide additional cooling in another embodiment.

Similar example embodiments are contemplated for a CPU, APU, VPU, other processors, 5 G NR or other radios, or other heat producing components in the information handling system. Further, the fan dock control system on the information handling system may receive ongoing telemetrics and indications of executing software that may change as the information handling system is used when docked. This ongoing monitoring of telemetrics and changes in executing software applications by the fan dock control system may dynamically change performance modes of one or more heat producing components as well as dynamically change maximum power allotments among those heat producing components. As described below, these dynamic changes may also result in the fan dock control system transmitting a control to adjust external fan settings of the wireless intelligent fan dock as well. Changes may include dynamically changing fan speeds of the fans or focusing on increase fan speed at a fan that aligns with a location of a heat producing component that is currently operating at a high level.

Proceeding to block 640, the fan dock control system having accessed the thermal table may determine that the power limit settings for one or more heat producing components or the system as a whole may be adjusted in an embodiment For example, power limit settings may be relaxed or increased to allow more power to components, upon determination that the information handling system is docked to the wireless intelligent fan dock. This adjusted power limit setting may be communicated to the PMU of the information handling system in an embodiment to adjust the control, monitoring and setting of power usage there. These power limit setting being relaxed permits one or more heat producing components such as processors or a 5 G NR radio to draw more power and perform at a higher level in accordance with the increased performance mode established for those components or some or all of the information handling system by the fan dock control system on the information handling system.

In one example, where the fan dock control system determines that a GPU is operating at a high level or that a gaming application or other GPU intensive application is executing on the information handling system, the fan dock control system may determine a revised power limit setting for the GPU from a thermal table. The fan dock control system may indicate a relaxed or greater power limit level is allowed for the GPU to a PMU of the information handling system at block 640. This change to the power limit level will facilitate a greater performance for GPU processing in an embodiment. The fan dock control system may also generate a dynamic fan speed request command to the intelligent wireless fan dock to increase general fan speed in an embodiment. The fan dock control system may also specify the dynamic fan speed request command to target a first fan, among a plurality of fans therein, that is situated under or near the location of the GPU or zone of the information handling system to be increased in fan speed to provide additional cooling over that of the other fan or fans operation to cool the docked information handling system in one embodiment.

In another example embodiment, the fan dock control system determines that a 5 G NR radio or other radio is operating at a high level or that a video conferencing application or other radio intensive application is executing on the information handling system. Thus, the fan dock control system may determine a revised power limit setting for the 5 G NR radio or other radio from a thermal table in an embodiment. The fan dock control system indicates this relaxed or greater power limit level is allowed for the 5 G NR radio or other radio to a PMU of the information handling system at block 640. This change to the power limit level will facilitate a greater performance for 5 G NR radio or other radio during transmission or reception of data in an embodiment. The fan dock control system may also generate a dynamic fan speed request command to the intelligent wireless fan dock to increase general fan speed in an embodiment. The fan dock control system may also specify the dynamic fan speed request command to target a first fan, among a plurality of fans therein, that is situated under or near the location of the 5 G NR radio or other radio or zone of the information handling system that may be increased in fan speed to provide additional cooling over the other fan or fans operation to cool the docked information handling system in one embodiment. Similar embodiments are contemplated for a CPU, APU, VPU, other processors, other radios, or other heat producing components in the information handling system including control for particular fans in the wireless intelligent fan dock that correspond with zones on the information handling system where those heat producing elements are housed.

At block 645, the fan dock control system of the information handling system may transmit a dynamic fan speed request command to increase or decrease fan speed at one or more fans of the intelligent wireless fan dock. This dynamic fan speed request command may be transmitted wirelessly according to embodiments herein. The dynamic fan speed request command may further be specific to a particular fan or set of fans on the intelligent wireless fan dock to correspond with a heat producing component location on the docked information handling system. In an alternative embodiment, this dynamic fan speed request command to increase or decrease fan speed of one or more fans may be transmitted via a wired coupling if one has been established. This dynamic fan speed request command for fan speed adjustments for and among the one or more fans of the intelligent wireless fan dock may be received dynamically in embodiments herein as the conditions of operation of the information handling system change as determined by the fan dock control system. The dynamic fan speed request issued by the fan dock control system of the docked information handling system is sent to the controller executing the fan speed control system on the wireless intelligent fan dock in an embodiment.

At block 650, the controller integrated circuit may increase or decrease fan speed of one or more fans of the intelligent wireless fan dock in accordance with a dynamic fan speed request command received from the fan dock control system on the information handling system. In one embodiment, the dynamic fan speed control may cause the controller of the wireless intelligent fan dock to increase or decrease the fan speed and, thus, airflow of any and all fans integrated in the wireless intelligent fan dock. In an example embodiment, the dynamic fan speed request commands received from the fan dock control system at the information handling system may include adjusting speeds of all fans integrated into the intelligent wireless fan dock simultaneously.

In another embodiment at block 650, the dynamic fan speed request command may include adjusting fan speed to increase fan speed and cooling for a first fan located under a location of the docked information handling system where a very active heat producing component is located while one or more other fans are kept at a lower fan speed level to assist in thermal control of the remainder of the docked information handling system. In an embodiment, as the dynamic fan speed request commands are received, which fans are increased in speed may be changed while others may be decreased depends on the current state of operation of heat producing components and their location on the docked information handling system. For example, if a dynamic fan speed request command is received to increase speed of a left-side fan of the intelligent wireless fan dock it may correspond to a location of a GPU that has been detected as very active or a GPU intensive software application executing on the docked information handling system. It is understood that a right-side fan or a left-side fan each may correspond to any individual or subset of heat producing component in a docked information handling system in various embodiments contemplated herein. Further, alignment of heat producing components may be different for different information handling systems models that may dock on the intelligent wireless fan dock in various embodiments.

Proceeding to block 655, the fan dock control system on the docked information handling system may detect a change in information handling system usage or a change in software applications executing. If a change is detected at block 655, the flow may return to block 630 and repeats the process to access the thermal table relating to the information handling system as docked, determine available performance modes and power limit settings and send a dynamic fan speed request command to the intelligent wireless fan dock. In an example embodiment, if a change in performance or software application is detected at the docked information handling system at block 655, an updated dynamic fan speed request command may be later received at the controller integrated circuit executing the fan speed control system of the intelligent wireless fan dock to adjust the speed of one or more fans accordingly. If the left fan was increased in speed and airflow capacity, but a change was detected that a right-side heat producing component may increase in activity on the information handling system, this change may be reflected in part of an updated dynamic fan speed request command. The updated dynamic fan speed request command may be directed to increase a fan speed for the right-side fan that may be aligned with, for example a CPU or a 5 G NR radio that is detected as increasing in activity. Then, in accordance with embodiments herein, the updated dynamic fan speed request command may cause the controller in the wireless intelligent fan dock to increase the speed of the right-side fan due to increased activity at those right-side components or detection of a CPU intensive or radio intensive application executing in an embodiment of the present disclosure. In some embodiments, the left-side fan speed may be requested to reduce speed by the dynamic fan speed request command due to reduced usage of a GPU. In other embodiments the left-side fan may remain at a high speed depending on conditions of docked information handling system operation. Again, it is understood that the left-side fan and right-side fan each may correspond to any individual or subset of heat producing component in a docked information handling system and may be different for different information handling systems models that may dock on the intelligent wireless fan dock in various embodiments.

If no change is detected in system component usage or executing software applications that may affect performance level requirements or power draw levels and therefore heat production at block 655, then flow proceeds to block 660. At block 660, the system determines if the information handling system has been de-docked from the intelligent wireless fan dock or has been shut down. The intelligent wireless fan dock docking switch or sensor may determine if the docked information handling system has been de-docked or removed from the intelligent wireless fan dock. A shut down of the docked information handling system or the docked information handling system entering a sleep mode or other dormant mode may be detected in BIOS and sent to the fan dock control system of the information handling system. If no de-docking is detected or a shut down process or sleep mode is not detected, the flow may return to block 655 for the fan dock control system on the information handling system to monitor for and detect if any dynamic changes to component usage or executing software types is detected that may affect power draw levels and heat levels produced at the information handling system generally or at one or more heat producing components in accordance with embodiments herein. If the information handling system is de-docked from the intelligent wireless fan dock or the information handling system is shut down or enters a sleep mode or other dormant mode, then the method may end.

The blocks of the flow diagram of FIG. 6 or steps and aspects of the operation of the embodiments herein and discussed above need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. An intelligent wireless fan dock to operate with an information handling system comprising:
    a cooling fan and a power source;
    a controller integrated circuit;
    a docking sensor to detect a docking event and to indicate to the controller integrated circuit that the information handling system has docked with the intelligent wireless fan dock;
    a wireless module to establish a wireless link with the information handling system upon detection of the docking event via the docking sensor;
    the controller integrated circuit configured to receive a dynamic fan speed request command from a fan dock control system of the information handling system via the wireless link, where the fan speed request is generated by the fan dock control system based on changes in performance mode for at least one heat generating component of the information handling system due to the docking event and detected operating conditions of the information handling system; and
    the controller integrated circuit configured to adjust the speed of the cooling fan in accordance with the received dynamic fan speed request command.

2. The intelligent wireless fan dock of claim 1 further comprising:
    a plurality of cooling fans spaced across the intelligent wireless fan dock to provide cooling airflow at plural locations of the intelligent wireless fan dock.

3. The intelligent wireless fan dock of claim 2 further comprising:
    the dynamic fan speed request command received from the fan dock controller and directed to at least a first cooling fan of the plurality of cooling fans located in the intelligent wireless fan dock corresponding to a location of a heat producing component in the docked information handling system that is detected by the fan dock control system to require a higher performance level.

4. The intelligent wireless fan dock of claim 1 wherein the dynamic fan speed request command is received from the fan dock control system based on changes in permitted power draw limitations for at least one heat generating component of the information handling system due to the docking event and detected operating conditions of the information handling system.

5. The intelligent wireless fan dock of claim 1 wherein the dynamic fan speed request command is received from the fan dock control system based on accessing a thermal table for the docked information handling system and intelligent wireless fan dock pairing for permitted increased performance modes and adjusted power draw limitations for the at least one heat producing component.

6. The intelligent wireless fan dock of claim 1 wherein the dynamic fan speed request command is received from the fan dock control system based on a detected software application executing on the docked information handling system and the detected software application classified by type of heat producing component to be used in the docked information handling system during execution of the detected software application.

7. The handheld controller of claim 1, wherein the docking sensor is a mechanical or electrical switch to detect the docking event.

8. The intelligent wireless fan dock of claim 7 wherein the wireless module commences a Bluetooth (BT) pairing procedure between the intelligent wireless fan dock and a BT wireless adapter at the docked information handling system.

9. The intelligent wireless fan dock of claim 1 wherein the docking sensor is a near field communication (NFC) module to detect the docking event via proximity with a reciprocal NFC radio of the information handling system; and
    the NFC module commences auto-pairing via a Bluetooth (BT) wireless module between the intelligent wireless fan dock and a BT wireless adapter at the docked information handling system.

10. An information handling system to operate with an intelligent wireless fan dock comprising:
    a processor, a memory, and a power source with a power management unit (PMU);
    at least one heat producing component selected from the processor, a graphics processing unit, or a wireless radio;
    a wireless adapter to establish a wireless link with the intelligent wireless fan dock having an extended fan cooling capacity upon a docking event with the intelligent wireless fan dock;
    the processor configured to execute code instructions of a fan dock control system to receive an indication of the docking event and to access a thermal table for the information handling system and the intelligent wireless fan dock pairing;
    the fan dock control system configured to determine that the information handling system and the intelligent wireless fan dock pairing enables an increased performance mode and altered power draw limitations for the docked information handling system relative to the information handling system in an undocked state;
    the fan dock control system configured to monitor a usage level of the at least one heat producing component and to generate a dynamic fan speed request command for extended fan cooling capacity from a first fan in the intelligent wireless fan dock; and
    the wireless adapter configured to transmit the dynamic fan speed request command for the extended fan cooling capacity to the intelligent wireless fan dock.

11. The information handling system of claim 10
    wherein the fan dock control system is configured to monitor a usage level of a second heat producing component and to generate an updated dynamic fan speed request command for extended fan cooling capacity from the intelligent wireless fan dock;
    the fan dock control system is configured to coordinate the location of the second heat producing component with a location of a second fan in the intelligent wireless fan dock; and the wireless adapter to transmit the updated dynamic fan speed request command for the extended fan cooling capacity to the intelligent wireless fan dock to increase fan speed at the second fan.

12. The information handling system of claim 11 wherein the fan dock control system is configured to monitor a usage level of the at least one heat producing component and to generate an updated dynamic fan speed request command to reduce the extended fan cooling capacity from the first fan in the intelligent wireless fan dock; and the wireless adapter is configured to transmit the updated dynamic fan speed request command to reduce the extended fan cooling capacity of the first fan to the intelligent wireless fan dock.

13. The information handling system of claim 10 wherein the fan dock control system is configured to generate the dynamic fan speed request command based on detected power draw levels and performance mode monitored for the at least one heat generating component of the information handling system.

14. The information handling system of claim 10 wherein the fan dock control system is configured to generate an updated dynamic fan speed request command based on detected changes in power draw levels and performance mode monitored for a second heat generating component of the information handling system such that the updated dynamic fan speed request command is correlated with the detected changes for the second heat generating component.

15. The information handling system of claim 10 wherein the fan dock control system is configured to generate the dynamic fan speed request command to increase speed of the first fan based on a detected executing software application on the information handling system corresponding to the first heat generating component to be intensively used by the detected executing software application.

16. The information handling system of claim 10 wherein the fan dock control system is configured to generate an updated dynamic fan speed request command based on detected changes among detected executing software applications to detect a second executing software application on the information handling system correlated to a second heat generating component to be intensively used such that the updated dynamic fan speed request command is directed to increase fan speed at a second fan corresponding with a location of the second heat generating component on the information handing system.

17. A method of docking an information handling system to an intelligent wireless fan dock comprising:

detecting, with a docking sensor, a docking event at the intelligent wireless fan dock of the information handling system docking with the intelligent wireless fan dock;

establishing, with a wireless module, a wireless link to the docked information handling system upon detection of a docking event;

receiving, via wireless link at the intelligent wireless fan dock, a dynamic fan speed request command to adjust extended fan cooling airflow from fan dock control system operating at the docked information handling system, where the fan dock control system has determined that the docked information handling system and the intelligent wireless fan dock pairing enable an increased performance mode and altered power draw limitations for the docked information handling system relative to the information handling system in an undocked state; and increasing, with a controller integrated circuit at the intelligent wireless fan dock, extended fan cooling airflow of a cooling fan based on the received dynamic fan speed request command due to the increased performance mode of at least one heat producing component of the docked information handling system.

18. The method of claim 17 further comprising:

increasing the extended fan cooling airflow of a first cooling fan of a plurality of cooling fans located in the intelligent wireless fan dock corresponding to a location of the at least one heat producing component in the docked information handling system.

19. The method of claim 17 further comprising:

adjusting, from an updated dynamic fan speed request command, the extended fan cooling airflow of the cooling fan, where the updated dynamic fan speed request command is generated based on changes in the altered power draw limitations for the at least one heat generating component of the information handling system due to detected changes operating conditions of the docked information handling system.

20. The method of claim 17 further comprising:

adjusting, from an updated dynamic fan speed request command, the extended fan cooling airflow of a second cooling fan of a plurality of cooling fans located in the intelligent wireless fan dock corresponding to a second location of a second heat producing component in the docked information handling system based on detected changes in operating conditions of the docked information handling system such that the second heat producing component has increased performance and power draw requirements.

* * * * *